(12) United States Patent
Chen et al.

(10) Patent No.: US 8,009,479 B2
(45) Date of Patent: Aug. 30, 2011

(54) MEMORY FORMED BY USING DEFECTS

(75) Inventors: Yen-Ting Chen, Taipei (TW);
Ching-Fang Huang, Taipei (TW);
Hung-Chang Sun, Kaohsiung (TW);
Chee Wee Liu, Taipei (TW)

(73) Assignee: National Taiwan University, Taipei (TW)

( * ) Notice: Subject to any disclaimer, the term of this patent is extended or adjusted under 35 U.S.C. 154(b) by 75 days.

(21) Appl. No.: 12/617,516

(22) Filed: Nov. 12, 2009

(65) Prior Publication Data

US 2011/0032765 A1  Feb. 10, 2011

(30) Foreign Application Priority Data

Aug. 6, 2009 (TW) .............................. 98126643 A

(51) Int. Cl.
*G11C 16/06* (2006.01)
(52) U.S. Cl. ................... 365/185.18; 365/103; 365/114; 365/174; 365/212
(58) Field of Classification Search ............. 365/185.18, 365/103, 114, 174, 212
See application file for complete search history.

(56) References Cited

U.S. PATENT DOCUMENTS

2009/0201739 A1 * 8/2009 Terai ......................... 365/185.18

OTHER PUBLICATIONS

Bawedin et al.: "Innovating SOI Memory Devices Based on Floating-Body Effects", Solid State Electronics 51 (2007) Apr. 25, 2007, pp. 1252-1262.

* cited by examiner

*Primary Examiner* — Thong Q Le

(57) ABSTRACT

A non-volatile memory is provided. The non-volatile memory comprises at least a silicon-on-insulator transistor including a substrate; an insulating layer disposed on the substrate; an active region disposed on the insulating layer; and an energy barrier device disposed in the active region and outputting a relatively small current when the non-volatile memory is read.

18 Claims, 12 Drawing Sheets

MEMORY FORMED BY USING DEFECTS

FIELD OF THE INVENTION

The present invention relates to a memory, and more particularly to a non-volatile memory formed by using defects in a channel.

BACKGROUND OF THE INVENTION

With the diminution and diverse functions of the electronic product, the threshold voltage and current consumption of the memory therein are also getting lower. For a non-volatile memory, the material used and the storage method are both aiming at enhancing endurance times of reading, reducing the time of data writing/reading/erasing, prolonging the data retention time and reducing power consumption during operation.

Please refer to FIG. 1(a), which shows a conventional EEPROM during writing. The EEPROM 10 has a logical state. For example, the structure of EEPROM 10 with a NMOS includes a p-type substrate 11, electric charges 15 and a gate 14. The p-type substrate 11 includes a source S and a drain D, and the gate 14 includes a dielectric layer 12 and a floating gate 13. During writing of the EEPROM 10, the source S and drain D are connected to the ground GND, and a positive voltage of 20 V is applied to the gate 14. The tunneling effect is induced by the vertical electric field, which leads to the electrons 15 tunneling through the dielectric layer 12 into the floating gate 13 and being trapped in the floating gate 13.

Please refer to FIG. 1(b), which shows a conventional EEPROM during erasing. For example, during the erasing of the EEPROM structure with a NMOS, a positive voltage of 20 V is applied to the drain D, and the gate 14 is connected to the ground GND. The high electric field induces the tunneling effect, which leads to the electrons 15 tunneling from the floating gate 13 into the drain D, so that the electrons 15 in the floating gate 13 are removed. The logical state can be changed after the above-mentioned method of writing and erasing. The disadvantage of using the floating gate 13 to trap the electric charges 15 is that once there are defects in the dielectric layer 12 around the floating gate 13, a part of the electric charges 15 will be lost. Due to the advancement of processes and diminution of elements, the thickness of the dielectric layer 12 is getting thinner. Therefore, another new structure is proposed.

Please refer to FIG. 2, which shows the structure of a conventional SONOS memory. The SONOS memory 30 includes a first substrate 36 and a gate 34, wherein the gate 34 includes a first dielectric layer 35, a nitride layer 31, a blocking oxide layer 32 and a polysilicon layer 33. The function of the nitride layer 31 is similar to that of the floating gate 13, which are both used for trapping electrons. The difference between the nitride layer 31 and the floating gate 13 is that the nitride layer 31 includes many films of discrete electrons storage areas. Besides, the blocking oxide layer 32 on the nitride layer 31 can prevent the electrons trapped by the nitride layer 31 from gate induced leakage. Moreover, the blocking oxide layer 32 on the nitride layer 31 can also reduce the writing voltage and enhance the endurance and reliability of the SONOS memory 30.

A new memory technology is proposed in the essay "Innovating SOI memory devices based on floating-body effects" by M. Bawedin et al., which stores the amount of carriers in the floating body to affect the threshold voltage of the device and modulate the magnitude of the drain current.

Please refer to FIG. 3(a), which shows the floating body cell (FBC) memory device during writing. The FBC memory 40 includes a hole 41, an electron 42, a p-type substrate 43, an insulating layer 44, a depletion region 45, a pinch-off region 46, a first gate G1, a second gate G2, a first source S1 and a first drain D1. The first source S1 and the second gate G2 are connected to the ground (0 V).

For example, during writing of the n-type MOSFET FBC memory 40, a first gate voltage $V_{G1}$ is applied to the first gate G1, and a first drain voltage $V_{D1}$ is applied to the first drain D1. When the first gate voltage $V_{G1}$ is larger than a threshold voltage $V_T$ ($V_T$ is a positive voltage for an n-type MOSFET) and the first drain voltage $V_{D1}$ is larger than the first gate voltage $V_{G1}$, the pinch-off region 46 is formed in the depletion region 45. At this time, the impact ionization leads to the electron-hole pairs generating near the junction of the first drain D1 and the first gate G1. The electrons 42 drift from the pinch-off region 46 into the first drain D1 due to the high electric field. The holes 41 drift and diffuse into the first p-type substrate 43 (floating body). This increases the amount of holes 41 in the floating body, and thus reduces the threshold voltage $V_T$ and increases the current from the first drain D1 to the first source S1. Hence, the current from the first drain D1 to the first source S1 can be adjusted through the increment of holes 41 in the first p-type substrate 43.

Please refer to FIG. 3(b), which shows the FBC memory device during reading. During reading of the FBC memory 40, the first gate voltage $V_{G1}$ is applied to the first gate G1, and the first drain voltage $V_{D1}$ is applied to the first drain D1. When the first gate voltage $V_{G1}$ is larger than the threshold voltage $V_T$ and the first drain voltage $V_{D1}$ is smaller than the first gate voltage $V_{G1}$, an inversion region 47 is formed in the active region 45. At this time, since the first drain D1 collects the electrons 42, the magnitude of the drain current is modulated by the body effect that can indicate the amount of holes 41 storing in the substrate. This different current state can be used for representing a logical state.

Please refer to FIG. 3(c), which shows the floating-body capacitor of the FBC memory device. The disadvantage of the FBC memory device 60 is the leakage current of the floating-body capacitor 48 and source S1. This junction is forward that causes the holes 41 to flow through the floating body capacitor 48 to the source S1. This significantly shortens the data retention time (0.1 second). Therefore, the FBC memory device 60 needs to be refreshed periodically, and thus the power consumption thereof is increased.

In order to overcome the drawbacks in the prior art, a memory formed by using defects is provided. The particular design in the present invention not only solves the problems described above, but also is easy to be implemented. Thus, the present invention has the utility for the industry.

SUMMARY OF THE INVENTION

In accordance with one aspect of the present invention, a non-volatile memory formed by using channel defects in the channel is provided. The non-volatile memory has the advantages of low power consumption, low cost, high density and long data retention time.

In accordance with another aspect of the present invention, a non-volatile memory is provided. The non-volatile memory comprises at least a silicon-on-insulator transistor including a substrate; an insulating layer disposed on the substrate; an active region disposed on the insulating layer; and a channel defects engineering disposed in the active region and outputting two or more current states when the non-volatile memory is read.

Preferably, the device has an accumulation current having a high current state and a low current state; the energy barrier is formed by using a defect unit in the channel; the energy barrier device forms an energy barrier in the active region; the energy barrier has a magnitude inversely proportional to that of the accumulation current; the accumulation current is in the high current state when the magnitude of the energy barrier is smaller than that of the accumulation current; and the accumulation current is in the low current state when the magnitude of the energy barrier is larger than that of the accumulation current.

In accordance with a further aspect of the present invention, a memory is provided. The memory comprises a semiconductor having a first state; and a defect unit converting the first state into a second state.

Preferably, the memory is a non-volatile memory.

Preferably, the semiconductor is a transistor.

Preferably, the semiconductor comprises an insulating layer.

Preferably, both the first and the second states are logical states.

Preferably, the semiconductor comprises an active region having an accumulation current; the defect unit is disposed in the active region, and changes the accumulation current stepwise to convert the first state into the second state; and the second state further comprises a plurality of states.

In accordance with further another aspect of the present invention, a memory is provided. The memory comprises at least a semiconductor including an active region having an accumulation current and a plurality of carriers; a gate having a gate voltage; and a drain having a drain voltage, wherein the gate voltage and the drain voltage control a quantity of the plurality of carriers to change the accumulation current.

Preferably, the memory is a non-volatile memory.

Preferably, the memory is formed by using a defect in a channel.

Preferably, the semiconductor is a transistor.

Preferably, the accumulation current has one selected from a group consisting of a high current state, a low current state and an initial current state.

Preferably, the active region comprises at least a defect unit.

Preferably, the pluralities of carries are ones of electrons and holes.

Preferably, the accumulation current is changed stepwise.

Preferably, the semiconductor comprises an insulating layer.

In accordance with further another aspect of the present invention, a method for manufacturing a memory is provided. The method comprises steps of (a) providing a substrate; (b) forming an active region on the substrate; (c) detecting whether there is a defect in the active region; and (d) manufacturing at least a defect in the active region if there is no defect therein.

Preferably, the method further comprises the following sub-steps after the step (d): (e) using the defect to form an energy barrier to enable the memory to have a first state; and (f) changing the energy barrier to enable the memory to be converted from the first state into a second state.

Preferably, the memory is a semiconductor element.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

The preferred embodiments of the present invention adopt the general n-type TFT semiconductor process, which only needs to use the polysilicon thin film transistor. Compared with the flash memory process, the present invention does not need extra expenditure of costs at all.

Figure 1A:
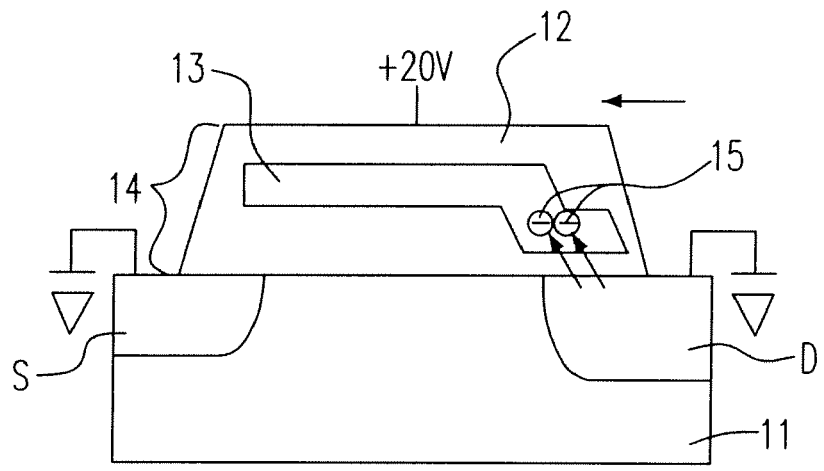
FIG. 1(a) shows a conventional EEPROM during writing.
Figure 1B:
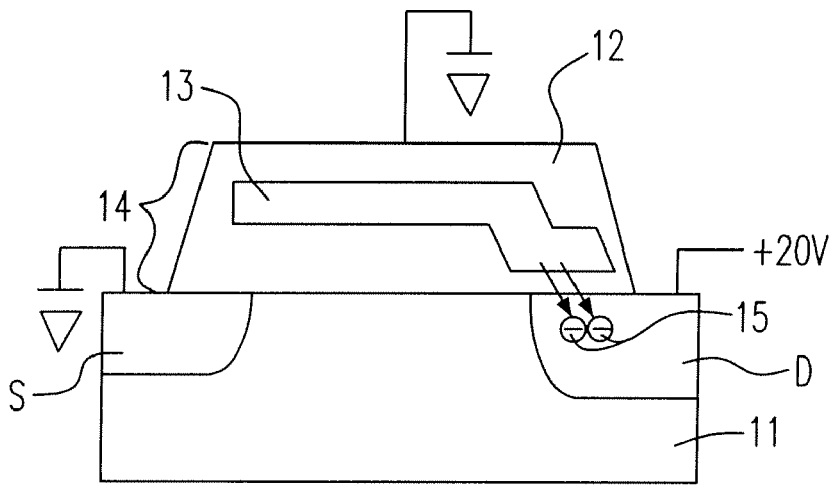
FIG. 1(b) shows a conventional EEPROM during erasing.
Figure 2:
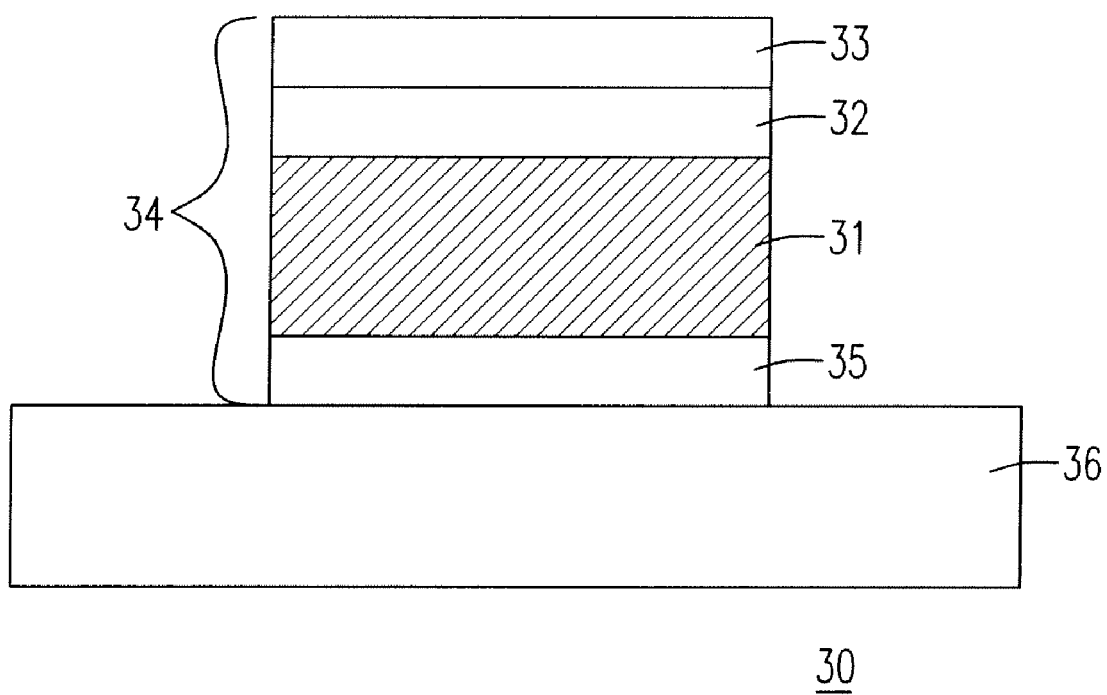
FIG. 2 shows the structure of a conventional SONOS memory.
Figure 3A:
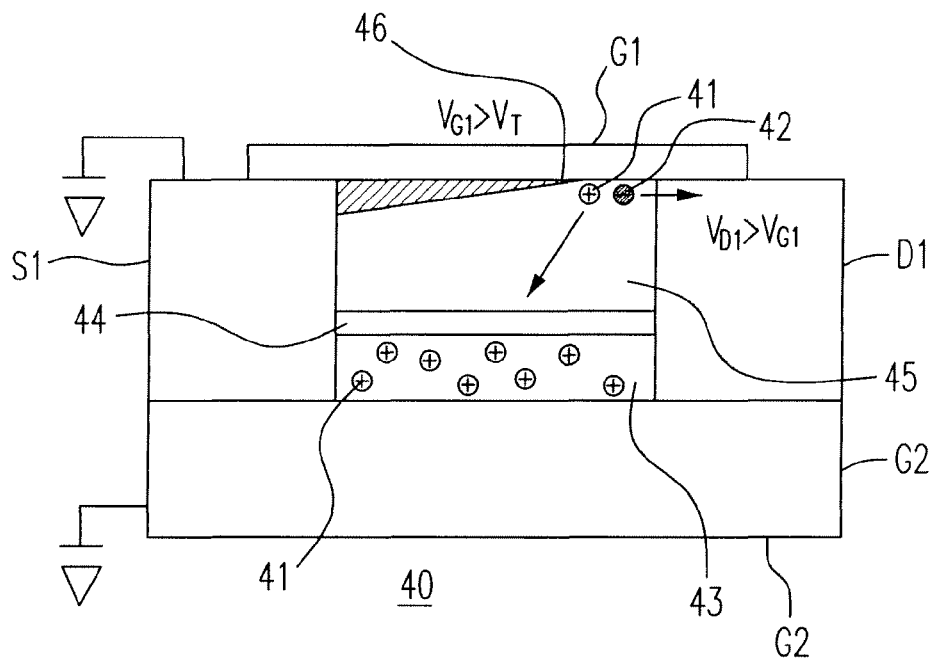
FIG. 3(a) shows the FBC memory device during writing.
Figure 3B:
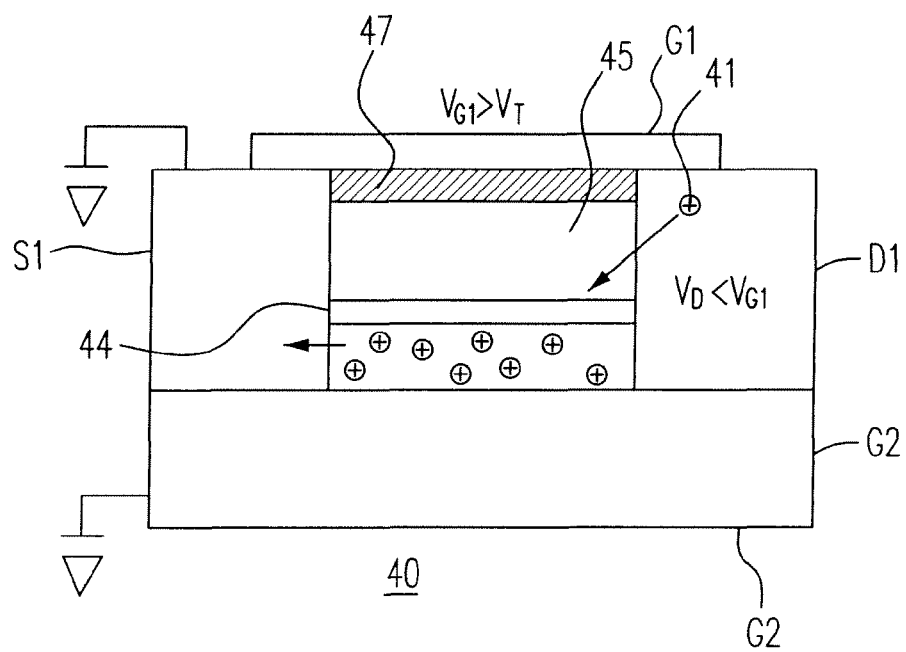
FIG. 3(b) shows the FBC memory device during reading.
Figure 3C:
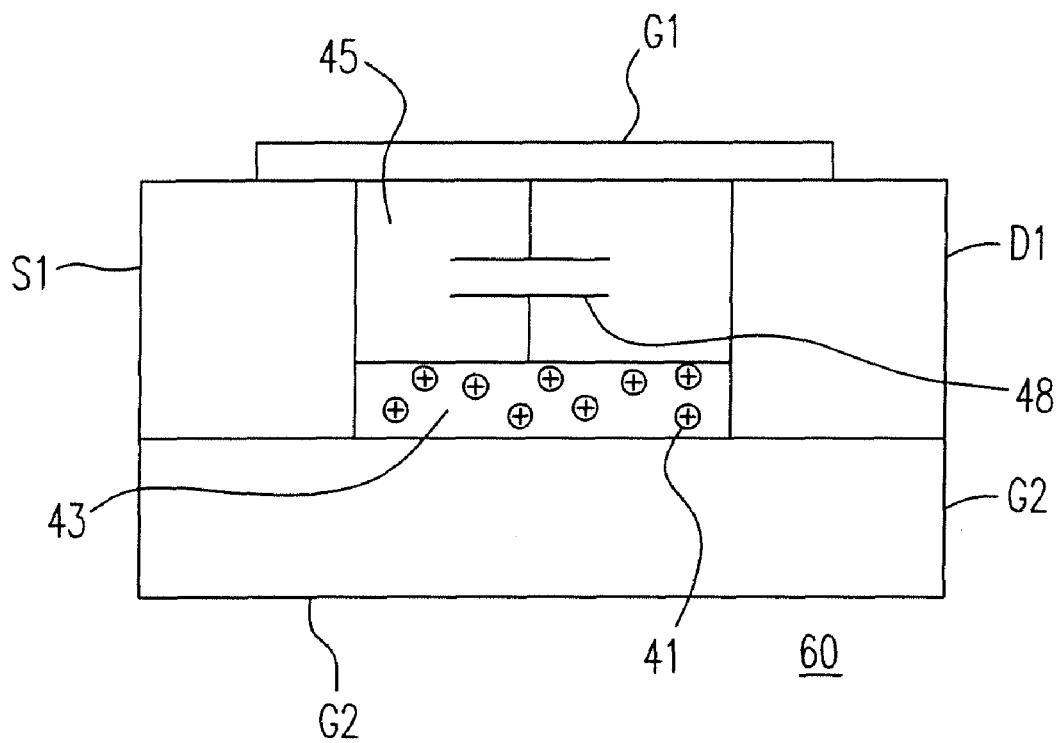
FIG. 3(c) shows the floating-body capacitor of the FBC memory device.
Figure 4A:
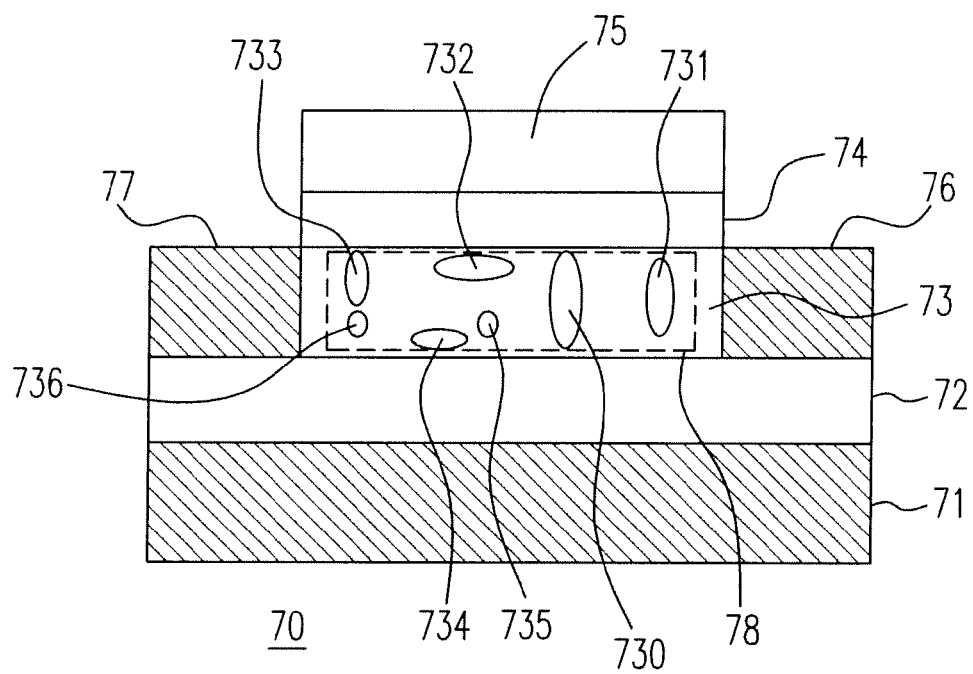
FIG. 4(a) shows the memory having defects according to a preferred embodiment of the present invention.

Please refer to FIG. 4(a), which shows the memory having defects according to a preferred embodiment of the present invention. The memory having defects 70 includes a second substrate 71, a first insulating layer 72, a p-type polysilicon active region 73, a gate insulating layer 74, a third gate 75, a second drain 76, a second source 77 and defects 730-736. The defects 730-736 form an energy barrier device 78.

Figure 4B:
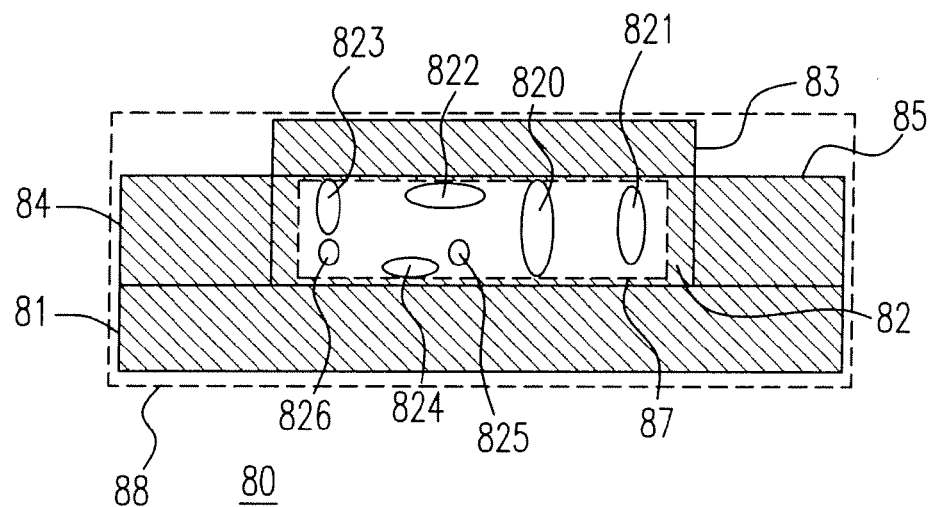
FIG. 4(b) shows the memory having a defect unit according to a preferred embodiment of the present invention.

Please refer to FIG. 4(b), which shows the memory having a defect unit according to a preferred embodiment of the present invention. The memory having a defect unit 80 includes a third substrate 81, a fourth gate 83, an active region 82, a third source 84, a third drain 85 and defects 820-826. The defects 820-826 form a defect unit 87. The third substrate 81, the fourth gate 83, the gate channel 82, the third source 84 and the third drain 85 foam a first semiconductor 81. In FIG. 4(b), the first semiconductor 88 includes the slash portion except for the defect unit 87.

The process of the memory having defects 70 uses the general TFT process. Firstly, the second insulating layer 72 is deposited on the second substrate 71 by chemical vapor deposition. Then, an amorphous Si thin film (not shown) is deposited on the first insulating layer 72. Next, the excimer laser annealing is performed for the amorphous Si thin film to form the polysilicon active region 73 therein. At this time, the defects 730-736 are formed at the grain boundary of the polysilicon thin film. Subsequently, the high concentration $n^+$ dopant is doped into the second drain 76 and the second source 77 by ion implantation. Through the above-mentioned processes, the energy barrier device 78 is formed in the p-type polysilicon active region 73. Since the polysilicon is composed of many grains and there are many defects in the grain boundary, it is unnecessary to manufacture the energy barrier device 78 in the p-type polysilicon active region 73 if the polysilicon TFT is used as the memory. Besides, the memory having defects 70 can be piled up to form a multi-layer structure. This can significantly enhance the density and capacity of the memory.

The second substrate 71 can be a glass substrate or a silicon substrate, but is not limited thereto. The first insulating layer 72 is used for facilitating the deposition when the second substrate 71 is a glass substrate, and for isolating the second substrate 71 when it is a silicon substrate. The first insulating layer 72 can be omitted without affecting the main function of the memory having defects 70. The preferred embodiment of the present invention is exemplified by the n-type TFT, which includes the p-type polysilicon active region 73, the $n^+$ doped second drain 76 and the $n^+$ dope second source 77. However, the memory of the present invention is not limited to the n-type transistor. That is, the p-type polysilicon active region 73 can be replaced by an n-type polysilicon active region, the $n^+$ doped second drain 76 can be replaced by a $p^+$ doped drain, and the $n^+$ doped second source 77 can be replaced by a $p^+$ doped source.

Figure 5:
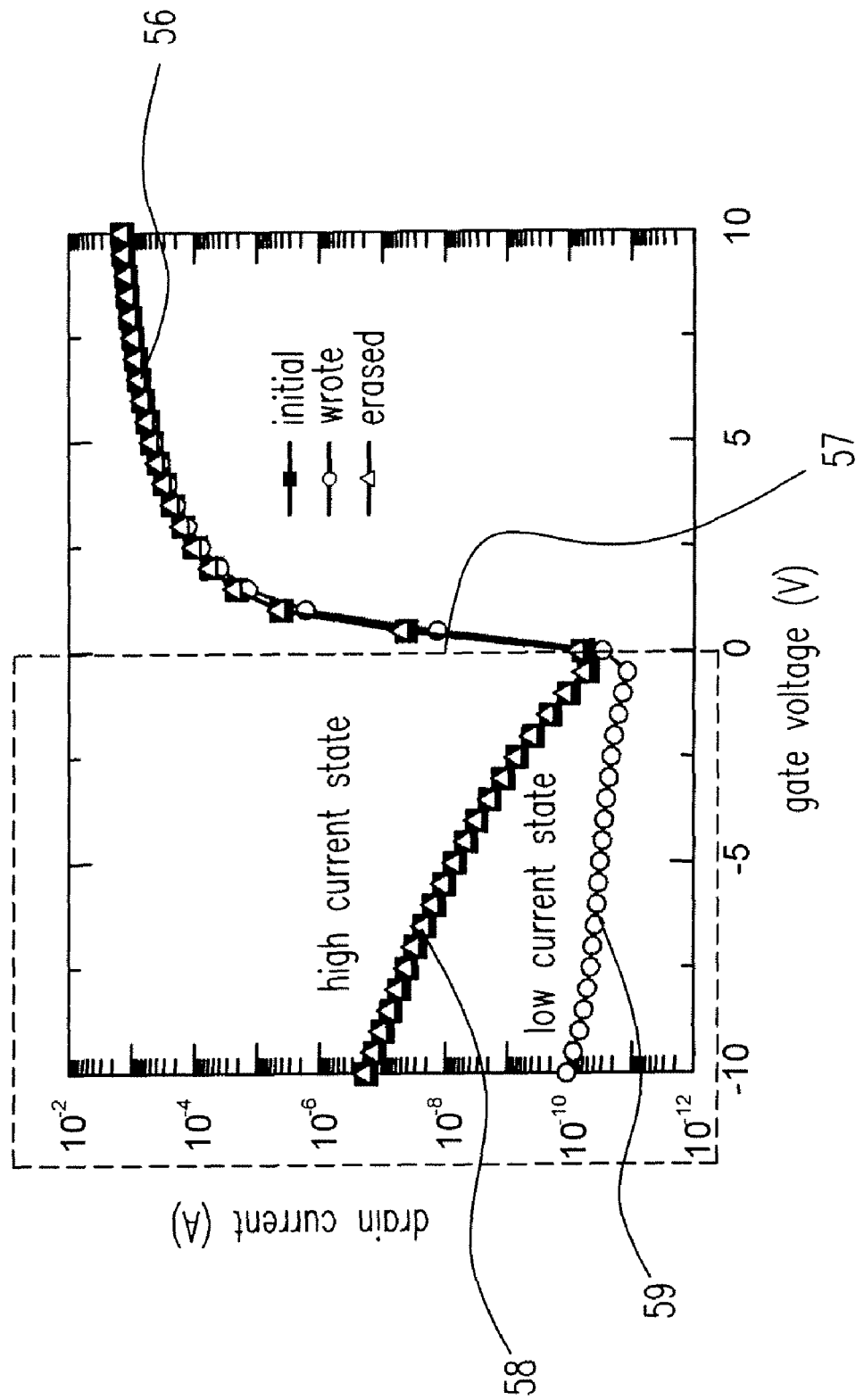
FIG. 5 shows the transfer characteristics of the n-channel thin film transistor with different operations.

Please refer to FIG. 5, which shows the transfer characteristics of the n-channel thin film transistor with different operations. The transverse axle represents the gate voltage of the memory having defects 70, and the vertical axle represents the drain current thereof. When the gate voltage is negative, the memory having defects 70 has a high current state 58 or a low current state 59. Carriers will be accumulated in the p-type polysilicon active region 73 (the carries are holes in the preferred embodiments of the present invention), so that it is called an accumulation region 57, and the current in the accumulation region 57 is called an accumulation current. When the gate voltage is positive, a conducting current 56 is generated. The conducting current 56 is far larger than the accumulation current, so the current consumption of the general memory is larger than that of the memory of the present invention.

Figure 6A:
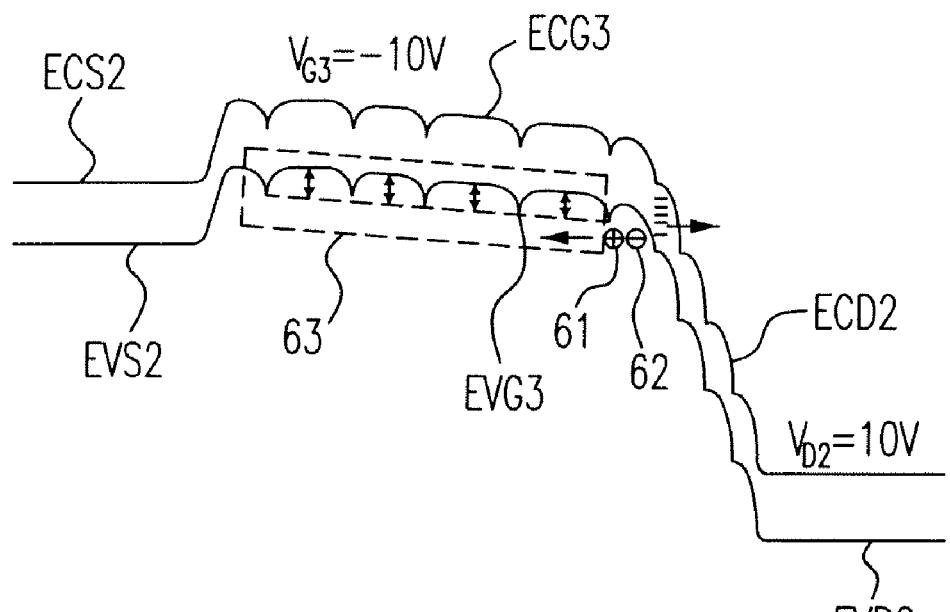
FIG. 6(a) shows the energy band of the memory having defects in a first state.

Please refer to FIG. 6(a), which shows the energy band of the memory having defects in a first state. The vertical axle represents the magnitude of the electron energy. In two piled energy band curves, the upper one refers to the conduction band and the lower one refers to the valence band. The conduction band from left to right includes a second source conduction band ECS2, a third gate conduction band ECG3 and a second drain conduction band ECD2. The valence band from left to right includes a second source valence band EVS2, a third gate valence band EVG3 and a second drain valence band EVD2. The third gate valence band EVG3 includes a smaller first defect energy barrier 63. A first hole 61 and a first electron 62 are formed in pairs near the third gate 75 and the second drain 76. When a third gate voltage $V_{G3}$ of −10 V is applied to the third gate 75 and a second drain voltage $V_{D2}$ of 10 V is applied to the second drain 76, the trap-assisted tunneling effect will be generated due to the large electric field formed by the second drain 76 and the third gate 75.

Near the third gate 75 and the second drain 76, the first electron 62 tunnels from the third gate valence band EVG3 into the second drain conduction band ECD2. However, the first hole 61 remains in the p-type polysilicon active region 73 to form the current. Since the first defect energy barrier 63 is smaller, it will not affect the flow of the first hole 61, thereby forming the high current state 58.

Figure 6B:
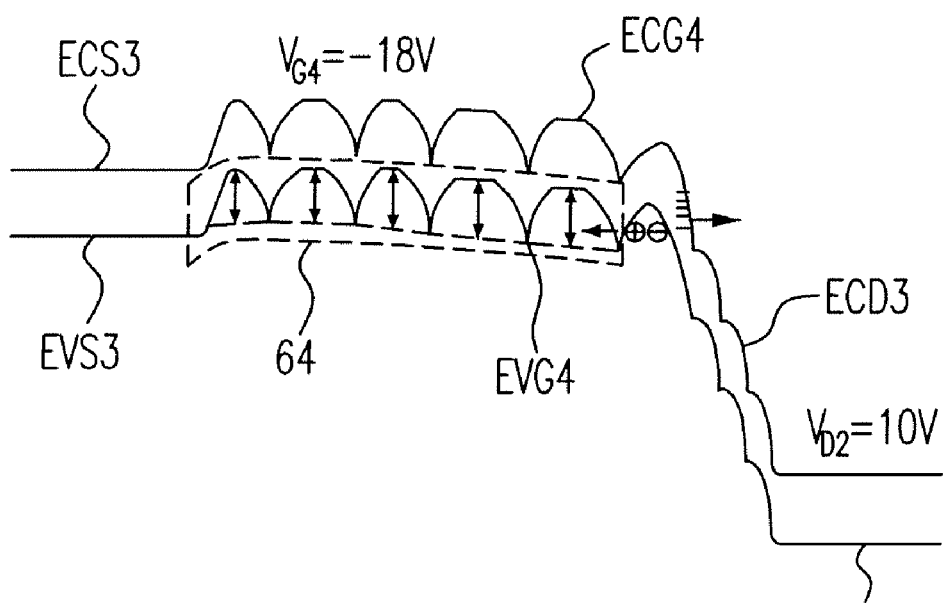
FIG. 6(b) shows the memory having defects in a second state.

Please refer to FIG. 6(b), which shows the energy band of the memory having defects in a second state. The vertical axle represents the magnitude of the electron energy. In two piled energy band curves, the upper one refers to the conduction band and the lower one refers to the valence band. The conduction band from left to right includes a third source conduction band ECS3, a fourth gate conduction band ECG4 and a third drain conduction band ECD3. The valence band from left to right includes a third source valence band EVS3, a fourth gate valence band EVG4 and a third drain valence band EVD3. The fourth gate valence band EVG4 includes a larger second defect energy barrier 64. The first hole 61 and the first electron 62 are formed in pairs near the third gate 75 and the second drain 76. When a fourth gate voltage $V_{G4}$ of −18 V is applied to the third gate 75 and a third drain voltage $V_{D3}$ of 10 V is applied to the second drain 76, the first state is converted into the second state. Due to the extremely large electric field formed by the second drain 76 and the third gate 75, the trap-assisted tunneling effect is even obvious.

Near the third gate 75 and the second drain 76, the first electron 62 tunnels from the fourth gate valence band EVG4 into the third drain conduction band ECD3. This enables the amount of the first holes 61 in the p-type polysilicon active region 73 to be increased rapidly, and the first holes 61 are trapped by the defects in the p-type polysilicon active region 73, thereby forming the second defect energy barrier 64. When the transistor is read again, the second defect energy barrier 64 is larger than the first defect energy barrier 63. Hence, this will affect the flow of the first hole 61, thereby forming the low current state 59.

The memory having defects 70 can use the high current state 58 to represent the state of logical 1, and use the low current state 59 to represent the state of logical 0. The ratio of the high current state 58 to the low current state 59 can be larger than 40. In practice, the magnitude of the current in the accumulation region 57 can be adjusted stepwise to expand to a multi-current state. Accordingly, the logical state can be expanded to a multi-value logical state.

The method for injecting carriers (the carriers are the first holes 61 in this embodiment) into the energy barrier device 78 includes the band-to-band tunneling, trap-assisted tunneling, thermionic emission, thermionic field emission, impact inonization or gate-induced drain leakage.

Figure 6C:
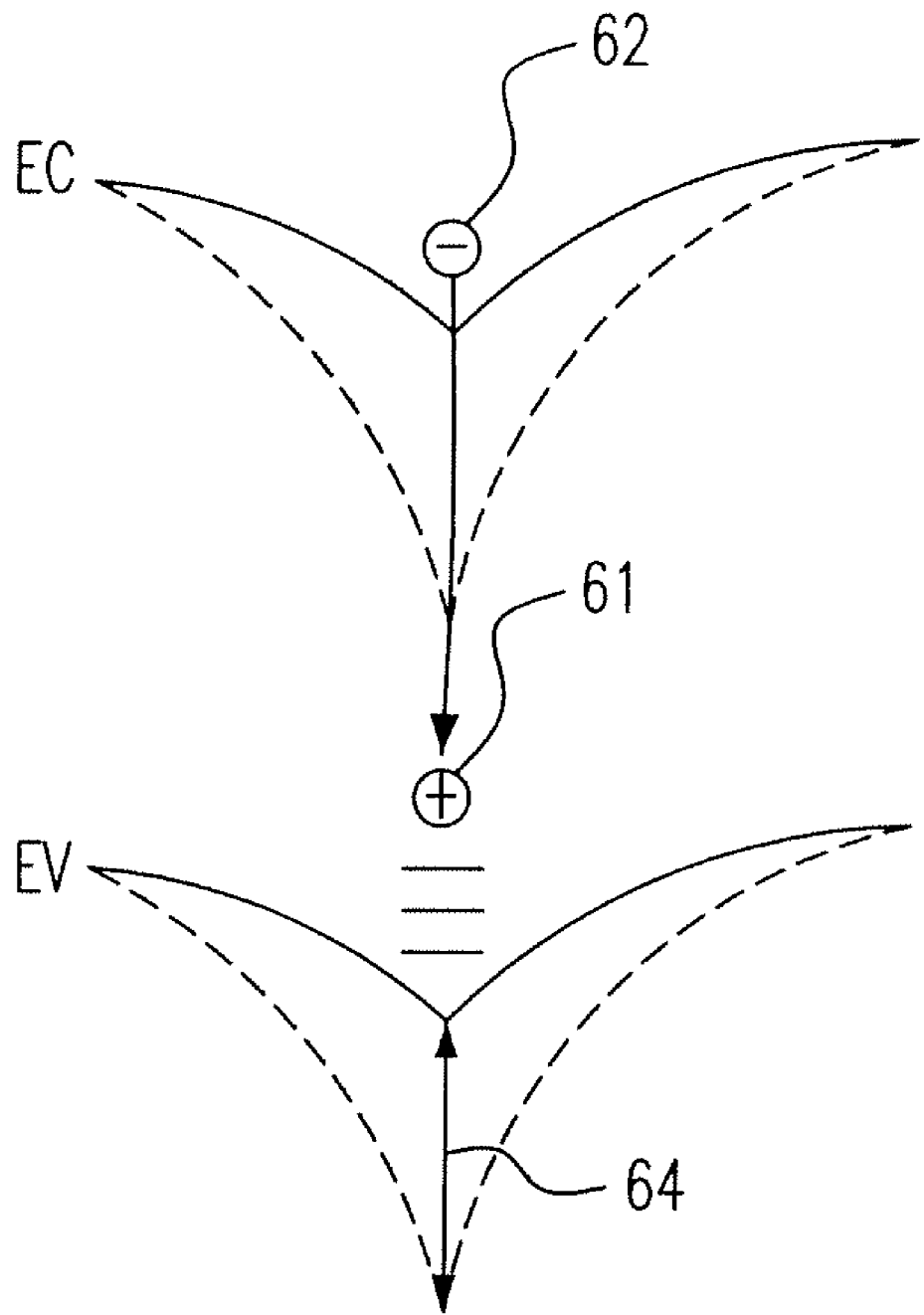
FIG. 6(c) shows the memory having defects during erasing.

Please refer to FIG. 6(c), which shows the memory having defects during erasing. EC represents a conduction band and EV represents a valence band. There are two better methods for erasing the memory having defects 70. The first method is to apply a fifth gate voltage $V_{G5}$ of 10 V and a fourth drain voltage $V_{D4}$ of 8 V. At this time, a first inversion region (not shown) is formed in the p-type polysilicon active region 73. The first electron 62 is recombined with the first hole 61 in the defect. This reduces the second defect energy barrier 64, thereby forming an initial current state which represents the state of the memory having defects 70 after being erased. The second method is to apply a sixth gate voltage $V_{G6}$ of 0 V and a fifth drain voltage $V_{D5}$ of −15 V. At this time, the memory having defects 70 is forward biased, and the majority carrier of the fifth drain will be injected into the p-type polysilicon active region 73 (the majority carrier is the first electron 62 in this embodiment) and recombined with the first hole 61, thereby forming the initial current state.

The method for erasing carriers (the carriers are the first holes 61 in this embodiment) in the energy barrier device 78 includes the forward junction, formation of the inversion region, band-to-band tunneling, trap-assisted tunneling, thermionic emission, thermionic field emission or impact ionization.

Figure 7A:
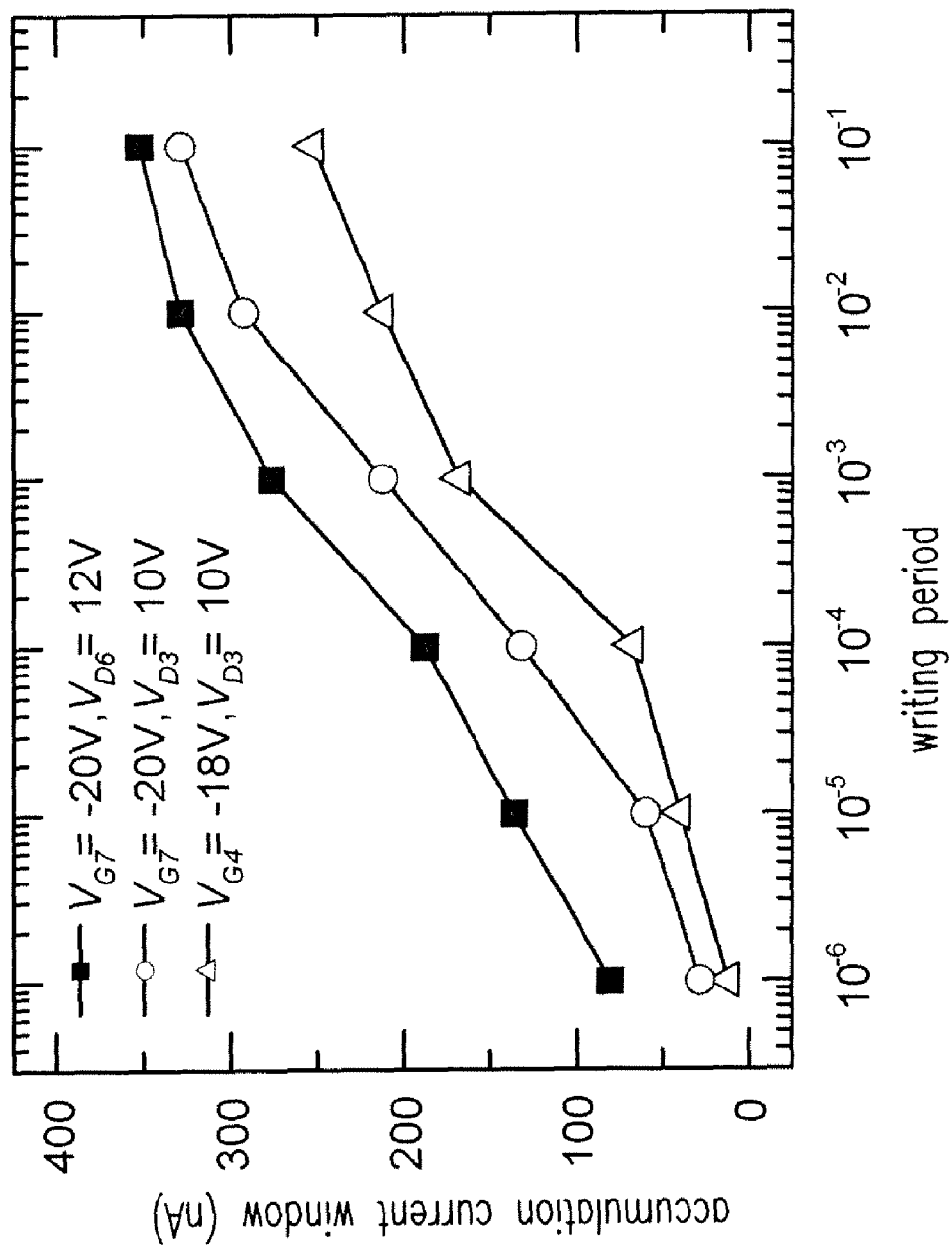
FIG. 7(a) shows the relationship between the writing period and the accumulation current window.

Please refer to FIG. 7(a), which shows the relationship between the writing period and the accumulation current window. When the memory having defects 70 is read, the difference between the high current state 58 and the low current state 59 is the accumulation current window. The curve formed by the connection of triangles represents that when the fourth gate voltage $V_{G4}$ of −18 V is applied to the third gate 75 and the third drain voltage $V_{D3}$ of 10 V is applied to the second drain 76, the accumulation current window is raised with the increase of the writing period. The curve formed by the connection of circles represents that when a seventh gate voltage $V_{G7}$ of −20 V is applied to the third gate 75 and the third drain voltage $V_{D3}$ of 10 V is applied to the second drain 76, the accumulation current window is raised with the increase of the writing period. The curve formed by the connection of squares represents that when the seventh gate voltage $V_{G7}$ of −20 V is applied to the third gate 75 and a sixth drain voltage $V_{D6}$ of 12 V is applied to the second drain 76, the accumulation current window is raised with the increase of the writing period.

The longer the writing period is, the larger the accumulation current window is. This is because when the writing period is increased, the amount of carriers (the carriers are the first holes 61 in this embodiment) accumulated in the energy barrier device 78 is increased. This raises the energy barrier of the energy barrier device 78, which lowers the accumulation current during reading and thus raises the accumulation current window.

However, when $V_{G7}$ is −20 V and $V_{D6}$ is 12 V, the accumulation current window is maximum for all writing periods. This is because when the negative gate voltage and the drain voltage applied are increased, the amount of carriers accumulated in the energy barrier device 78 is increased. This raises the energy barrier of the energy barrier device 78, which lowers the accumulation current during reading and thus raises the accumulation current window.

Figure 7B:
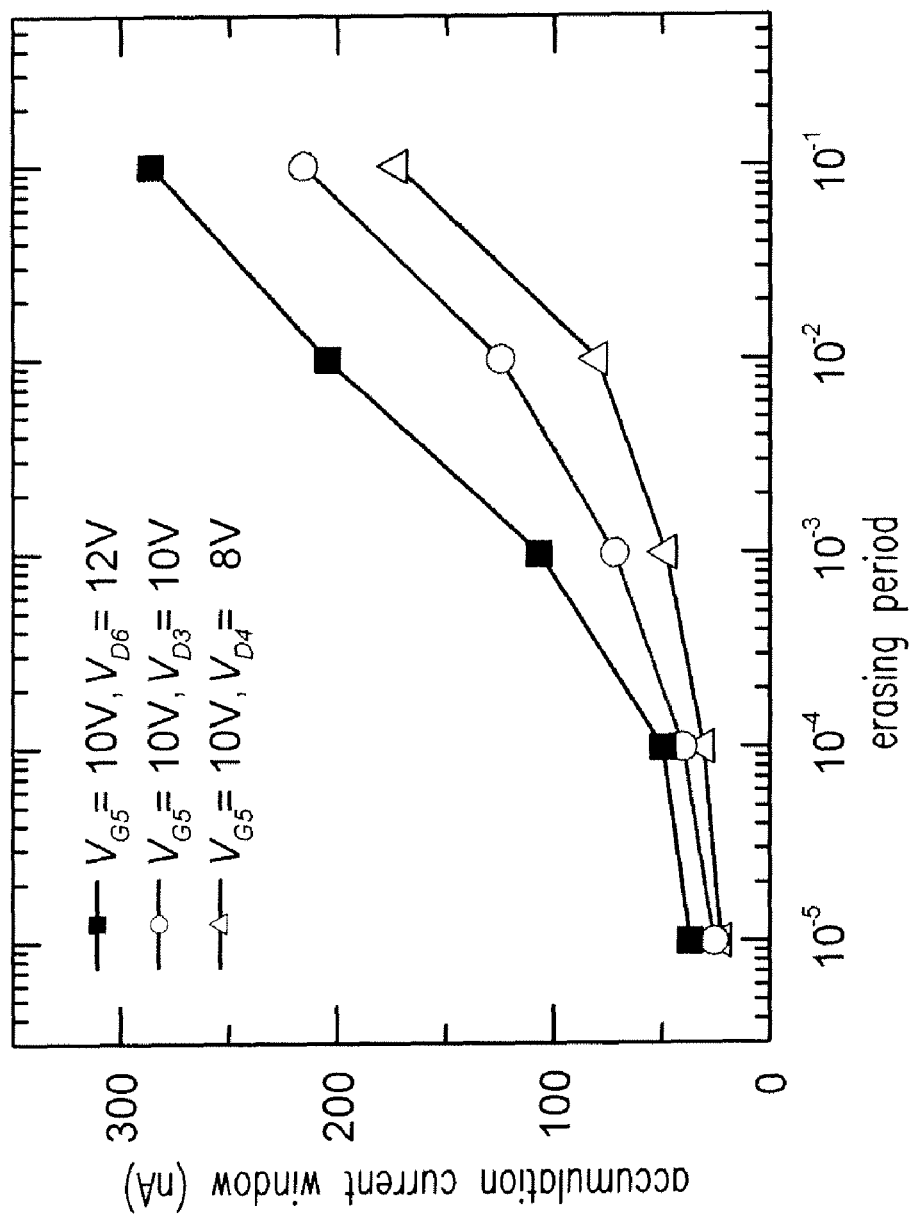
FIG. 7(b) shows the relationship between the erasing period and the accumulation current window.

Please refer to FIG. 7(b), which shows the relationship between the erasing period and the accumulation current window. The curve formed by the connection of triangles represents that when the fifth gate voltage $V_{G5}$ of 10 V is applied to the third gate 75 and the fourth drain voltage $V_{D4}$ of 8 V is applied to the second drain 76, the accumulation current window is raised with the increase of the erasing period. The curve formed by the connection of circles represents that when the fifth gate voltage $V_{G5}$ of 10 V is applied to the third gate 75 and the third drain voltage $V_{D3}$ of 10 V is applied to the second drain 76, the accumulation current window is raised with the increase of the erasing period. The curve fanned by the connection of squares represents that when the fifth gate voltage $V_{G5}$ of 10 V is applied to the third gate 75 and the sixth drain voltage $V_{D6}$ of 12 V is applied to the second drain 76, the accumulation current window is raised with the increase of the erasing period.

The longer the erasing period is, the larger the accumulation current window is. This is because when the erasing period is increased, the amount of carriers recombined in the energy barrier device 78 is increased. This reduces the energy barrier of the energy barrier device 78, which raises the accumulation current during reading and thus raises the accumulation current window.

However, when $V_{G5}$ is 10 V and $V_{D6}$ is 12 V, the accumulation current window is maximum for all writing periods. This is because when the gate voltage and the drain voltage applied are increased, the amount of carriers recombined in the energy barrier device 78 is increased. This reduces the energy barrier of the energy barrier device 78, which raises the accumulation current during reading and thus raises the accumulation current window.

Figure 7C:
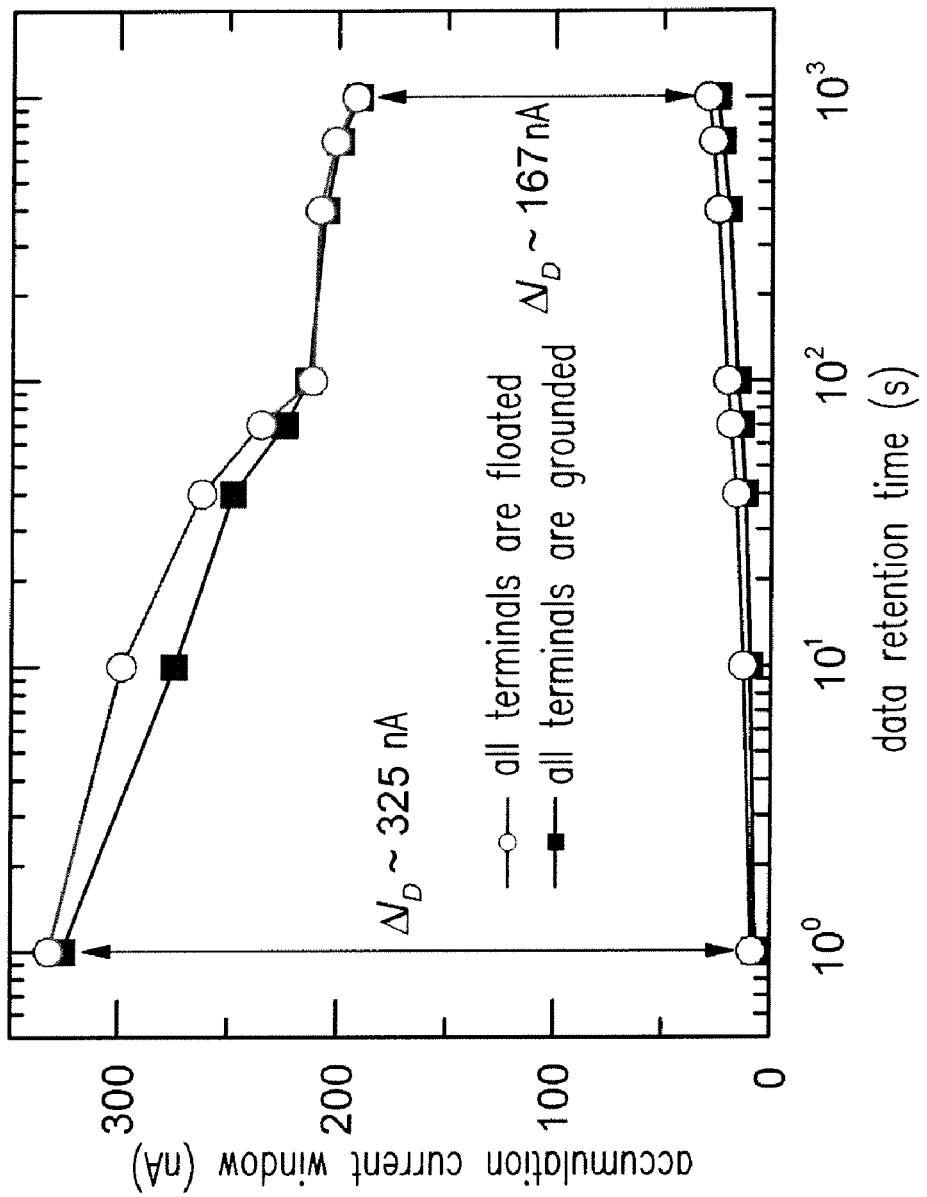
FIG. 7(c) shows the relationship between the data retention time and the accumulation current window.

Please refer to FIG. 7(c), which shows the relationship between the data retention time and the accumulation current window. The curve formed by the connection of squares represents the high current state 58 and the low current state 59 of the accumulation current when all terminals of the memory having defects 70 are grounded and the memory having defects 70 is written after 1-1000 seconds. The curve formed by the connection of circles represents the high current state 58 and the low current state 59 of the accumulation current when all terminals of the memory having defects 70 are floating and the memory having defects 70 is written after 1-1000 seconds.

As shown in FIG. 7(c), whether all terminals of the memory having defects 70 are grounded or floating, the high current state 58 of the accumulation current is about 330 nA and the low current state 59 thereof is about 5 nA when the memory having defects 70 is written and read after 1 second. Accordingly, the accumulation current reading range is about 325 nA. When the memory having defects 70 is written and read after 1000 seconds, the accumulation current window is still up to 167 nA. Therefore, the memory of the present invention does not need to be refreshed periodically, which significantly reduces the power consumption thereof.

Figure 7D:
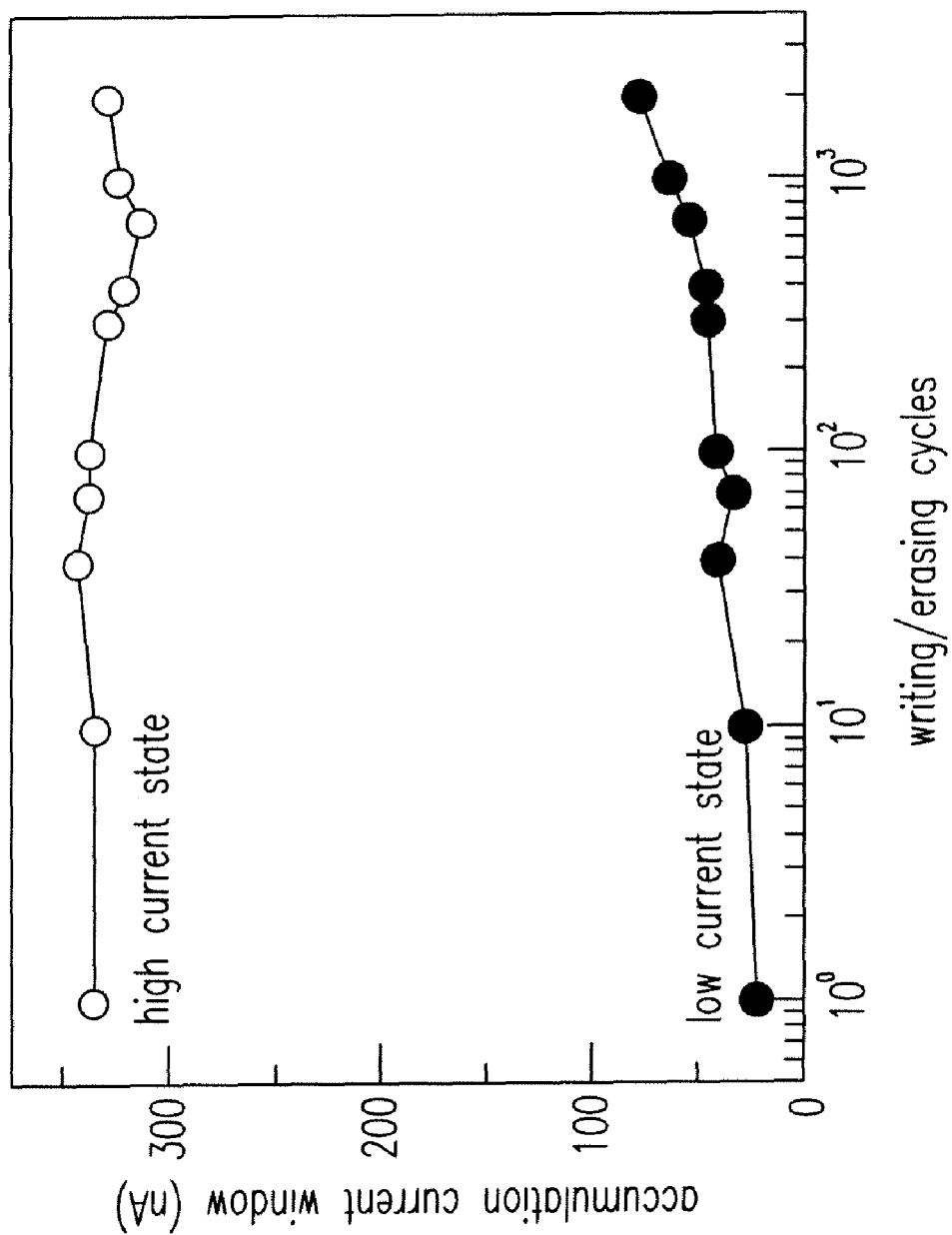
FIG. 7(d) shows the relationship between the writing/erasing cycles and the accumulation current window.

When the memory having defects 70 is written and then read, since it is reversely biased during reading, the first hole 61 in the energy barrier device 78 is not lost. In this situation, the memory having defects 79 can be read repeatedly. Please refer to FIG. 7(d), which shows the relationship between the writing/erasing cycles and the accumulation current window. When the times of writing/erasing reach 1000 times, the accumulation current is still kept at the low current state 59 or the high current state 58. This shows that the memory having defects 70 can be written and read repeatedly.

In conclusion, the memory having defects of the present invention has the advantages of low current consumption, low cost, high density, long data retention time and high reliability. Therefore, the present invention effectively solves the problems and drawbacks in the prior art, and thus it fits the demand of the industry and is industrially valuable.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:
1. A non-volatile memory, comprising:
   at least a silicon-on-insulator transistor including:
      a substrate;
         an insulating layer disposed on the substrate;
            an active region disposed on the insulating layer, and having an accumulation current; and
            an energy barrier device disposed in the active region, outputting a relatively small current when the non-volatile memory is read, and forming an energy barrier, wherein the energy barrier has a magnitude inversely proportional to that of the accumulation current.

2. The non-volatile memory as claimed in claim 1, wherein:
   the accumulation current has one of a high current state and a low current state;
   the energy barrier device is formed by using a defect in a channel;
   the energy barrier device forms the energy barrier in the active region;
   the accumulation current is in the high current state when the magnitude of the energy barrier is smaller than that of the accumulation current; and
   the accumulation current is in the low current state when the magnitude of the energy barrier is larger than that of the accumulation current.

3. A memory, comprising:
   a semiconductor having a first state and including:
      an active region having an accumulation current; and
   a defect unit converting the first state into a second state, and forming an energy barrier, wherein the energy barrier has a magnitude inversely proportional to that of the accumulation current.

4. The memory as claimed in claim 3, wherein the memory is a non-volatile memory.

5. The memory as claimed in claim 3, wherein the semiconductor is a transistor.

6. The memory as claimed in claim 3, wherein the semiconductor comprises an insulating layer.

7. The memory as claimed in claim 3, wherein both the first and the second states are logical states.

8. The memory as claimed in claim 3, wherein:
   the defect unit changes the accumulation current stepwise to convert the first state into the second state; and
   the second state further comprises a plurality of states.

9. A memory, comprising:
   at least a semiconductor including:
      an active region having an accumulation current and a plurality of carriers, wherein the accumulation current has one selected from a group consisting of a high current state, a low current state and an initial current state;
      at least a defect unit forming an energy barrier, wherein the accumulation current is in the high current state when the energy barrier has a magnitude smaller than that of the accumulation current;
   a gate having a gate voltage; and
   a drain having a drain voltage,
   wherein the gate voltage and the drain voltage control a quantity of the plurality of carriers to change the accumulation current.

10. The memory as claimed in claim 9, wherein the memory is a non-volatile memory.

11. The memory as claimed in claim 9, wherein the memory is formed by using a defect in a channel.

12. The memory as claimed in claim 9, wherein the semiconductor is a transistor.

13. The memory as claimed in claim 9, wherein the plurality of carries are ones of electrons and holes.

14. The memory as claimed in claim 9, wherein the accumulation current is changed stepwise.

15. The memory as claimed in claim 9, wherein the semiconductor comprises an insulating layer.

16. A method for manufacturing a memory, comprising steps of:
   (a) providing a substrate;
   (b) forming an active region on the substrate;
   (c) detecting whether there is a defect in the active region; and
   (d) manufacturing at least a defect in the active region if there is no defect therein.

17. The method as claimed in claim 16, further comprising the following sub-steps after the step (d):
   (e) using the defect to form an energy barrier to enable the memory to have a first state; and
   (f) changing the energy barrier to enable the memory to be converted from the first state into a second state.

18. The method as claimed in claim 16, wherein the memory is a semiconductor element.

* * * * *